US008027818B1

(12) United States Patent
Alterman et al.

(10) Patent No.: US 8,027,818 B1
(45) Date of Patent: Sep. 27, 2011

(54) SYSTEM AND METHOD FOR UNSTABLE-RESONATOR OPTICALLY PUMPED SEMICONDUCTOR LASERS

(75) Inventors: Deborah A. Alterman, Seattle, WA (US); Dawn M. Meekhof, Lake Forest Park, WA (US); Dennis D. Lowenthal, Edmonds, WA (US); Ananda K. Cousins, Seattle, WA (US)

(73) Assignee: Lockheed Martin Corporation, Bethesda, MD (US)

( * ) Notice: Subject to any disclaimer, the term of this patent is extended or adjusted under 35 U.S.C. 154(b) by 496 days.

(21) Appl. No.: 11/963,788

(22) Filed: Dec. 21, 2007

Related U.S. Application Data

(60) Provisional application No. 60/871,776, filed on Dec. 22, 2006.

(51) Int. Cl.
G06G 7/48 (2006.01)
(52) U.S. Cl. .......................................................... 703/6
(58) Field of Classification Search .................... 703/5, 6
See application file for complete search history.

(56) References Cited

U.S. PATENT DOCUMENTS

| | | | |
|---|---|---|---|
| 5,628,196 A | 5/1997 | Farmer | |
| 5,742,384 A | 4/1998 | Farmer | |
| 6,553,045 B2 | 4/2003 | Kaspi | |

OTHER PUBLICATIONS

Alan J. Kemp, Gareth J. Valentine, David Burns, Progress towards high-power, high-brightness neodymium-based thin-disk lasers, Progress in Quantum Electronics, vol. 28, Issue 6, 2004, pp. 305-344, ISSN 0079-6727, DOI: 10.1016/j.pquantelec.2004.11.001.*
Usability Net, "Rapid prototyping", 2002, http://web.archive.org/web/20021219034057/http://www.usabilitynet.org/tools/rapid.htm.*
Mackenzie, J.I.; Cheng Li; Shepherd, D.P.; , "Multi-watt, high efficiency, diffraction-limited Nd:YAG planar waveguide laser," Quantum Electronics, IEEE Journal of , vol. 39, No. 3, pp. 493-500, Mar. 2003 doi: 10.1109/JQE.2002.808158.*
Subramanian, "Heat Sink Profile Design Using FEA Simulation for Laser Heat Dissipation in a CD/DVD Optical Pick-up Unit", 12 pages, 2002, http://www.ansys.com/events/proceedings/2002/PAPERS/110.pdf.*

* cited by examiner

*Primary Examiner* — David Silver
(74) *Attorney, Agent, or Firm* — Charles A. Lemaire; Jonathan M. Rixen; Lemaire Patent Law Firm, P.L.L.C.

(57) ABSTRACT

Apparatus and method for designing and operating a solid-state laser that compensates for thermal lensing such that lasing instability is maintained at high pumping power. In some embodiments, the laser is an optically pumped semiconductor laser (OPSL). In some embodiments, a concave end facet is formed on the OPSL that at least compensates for thermal lensing at high pump power. In some embodiments, an external mirror is used for at least one end of the OPSL, wherein the external mirror at least compensates for thermal lensing at high pump power.

26 Claims, 6 Drawing Sheets

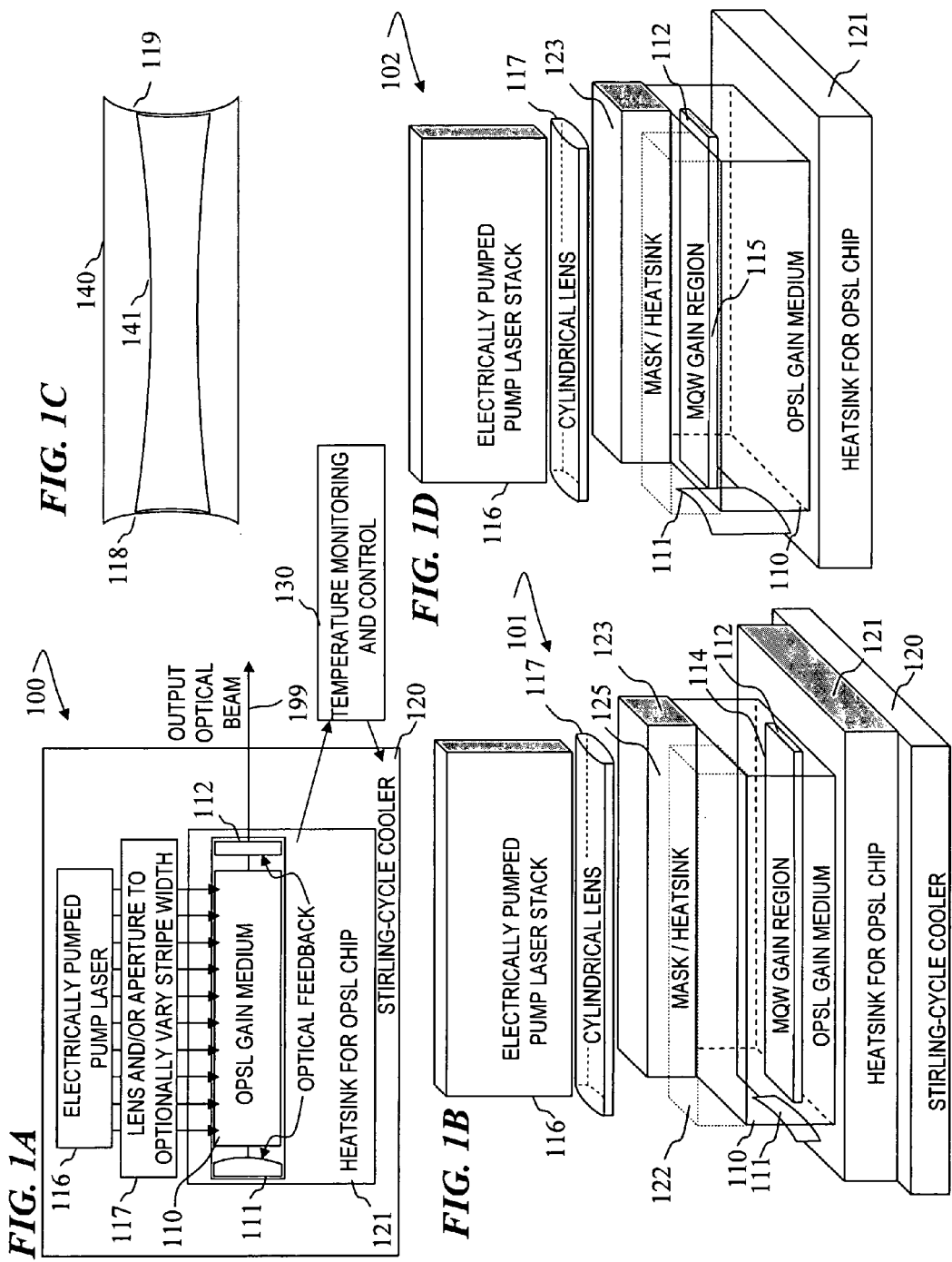

SYSTEM AND METHOD FOR UNSTABLE-RESONATOR OPTICALLY PUMPED SEMICONDUCTOR LASERS

RELATED APPLICATIONS

This claims benefit of U.S. Provisional Patent Application No. 60/871,776 titled "SYSTEM AND METHOD FOR DESIGNING AND MAKING UNSTABLE OPTICALLY PUMPED SEMICONDUCTOR LASERS" filed Dec. 22, 2006, which is incorporated herein by reference in its entirety.

STATEMENT OF GOVERNMENT INTEREST

This invention was made with Government support by the U.S. Air Force under contract FA9451-04-D-0412/0002. The government has certain rights in this invention.

FIELD OF THE INVENTION

The present invention relates to lasers and more particularly to optically pumped semiconductor lasers and methods for designing lasers that have intrinsic heat-induced self lensing such that a compensating lensing is added to obtain good beam quality, and in particular methods and apparatus to maintain a degree of resonator instability under large heat loads that would otherwise produce self lensing stability leading to poor beam quality.

BACKGROUND OF THE INVENTION

There is a need for an optically pumped laser that maintains a degree of resonator instability under large heat loads that would otherwise produce self lensing stability leading to poor beam quality.

BRIEF SUMMARY OF THE INVENTION

The present invention provides an apparatus and a method for designing, fabricating and operating an optically pumped solid-state laser (which, in some embodiments, includes an optically pumped semiconductor laser) that maintains a degree of resonator instability (and thus provides good beam quality, for example, as measured by a low $M^2$) under large heat loads that would otherwise produce self lensing stability leading to poor beam quality.

One example of an optically pumped semiconductor laser (OPSL) is described in U.S. Pat. No. 6,553,045 titled "MULTIPLE WAVELENGTH BROAD BANDWIDTH OPTICALLY PUMPED SEMICONDUCTOR LASER", which issued to Ron Kaspi on Apr. 22, 2003, and which is incorporated herein by reference.

An example of cooling methods for lasers is described in U.S. Pat. No. 5,628,196 titled "CRYOGENIC COOLING APPARATUS EMPLOYING HEAT SINK AND DIFFUSER PLATE FOR COOLING SMALL OBJECTS", which issued May 13, 1997 to Roger C. Farmer, and which is incorporated herein by reference.

An example of cooling methods and semiconductor lasers is described in U.S. Pat. No. 5,742,384 titled "COMPACT SCANNING INFRARED COUNTERMEASURE EMITTER", which issued Apr. 21, 1998 to Roger C. Farmer, and which is incorporated herein by reference.

BRIEF DESCRIPTION OF THE DRAWINGS

FIG. 1A is a block diagram of a laser 100 that has been designed according to the present invention.

FIG. 1B is a block diagram of a laser 101 that has been designed according to the present invention.

FIG. 1C is a block diagram of a laser gain medium 140 that has been designed according to the present invention.

FIG. 1D is a block diagram of a laser 102 that has been designed according to the present invention.

DETAILED DESCRIPTION OF THE INVENTION

Figure 3:
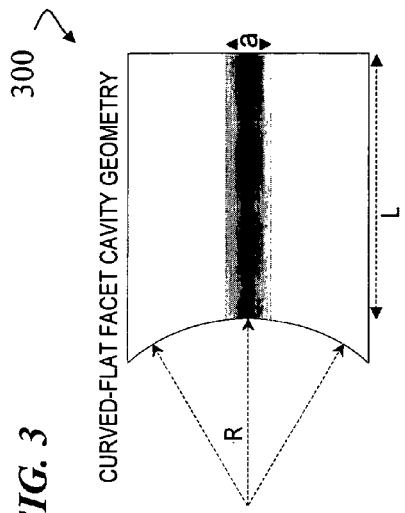
FIG. 3 shows an UNSTABLE RESONATOR GEOMETRY used in some embodiments.

Although the following detailed description contains many specifics for the purpose of illustration, a person of ordinary skill in the art will appreciate that many variations and alterations to the following details are within the scope of the invention. Accordingly, the following preferred embodiments of the invention are set forth without any loss of generality to, and without imposing limitations upon the claimed invention.

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component which appears in multiple Figures. Signals and connections may be referred to by the same reference number or label, and the actual meaning will be clear from its use in the context of the description.

A number of embodiments of the present invention embody and describe the laser as an optically pumped semiconductor laser (OPSL). For each such described embodiment, the present invention includes other embodiments wherein the laser gain medium is solid state but not semiconductor, or wherein the laser gain medium is electrically pumped and forms an electrically pumped semiconductor laser, but wherein the thermal lensing and the compensation for thermal lensing (e.g., iteratively changing the width of the pump stripe) are modeled and/or iteratively determined in a manner similar to the described embodiments.

A number of other embodiments of the present invention embody and describe the laser as an optically pumped solid-state laser (OPSSL), which is a generic term that includes both optically pumped semiconductor lasers (OPSLs) and other embodiments wherein the laser gain medium is solid state but not semiconductor. For each such described embodiment, the present invention includes other embodiments wherein the laser is an optically pumped semiconductor laser (OPSL), or wherein the laser is an electrically pumped semiconductor laser (EPSL), but wherein the thermal lensing and the compensation for thermal lensing are modeled and/or iteratively determined in a manner similar to the described embodiments.

As used herein, an unstable resonator and lasing instability refer to classical unstable resonators that do not form stable single- or multiple-mode lasing operation. In stable resonators, eigenmodes exist which do not change as the radiation makes round-trips through the cavity, while such eigenmodes do not exist for unstable resonators. In unstable resonators, there are no ray paths which will not eventually "walk out" of the cavity. Because of the instability, when lasing is established, the beam from an unstable resonator will more likely be a low-divergence, high quality beam than the beam from a multimode stable resonator.

FIG. 1A is a block diagram of a laser 100 that has been designed according to the present invention. Laser 100, when pumped at high power, has a gain medium that exhibits thermal lensing. Left uncompensated, such thermal lensing causes the resonator to be stable, which in turn supports many modes and results in poor beam quality. In some embodiments, the present invention provides a method for determining the required strength of a compensating optical effect, such as an external convex cylindrical mirror 111, having a diverging reflection that compensates for the converging effects of the thermal lensing. In some embodiments, a plurality of convex mirrors having different radii (and thus differing amounts of divergence can be swapped (one at a time) for convex mirror 111 until an optimum mirror is found, in order to provide differing amounts of compensation to counteract the thermal lensing. In some embodiments, the present invention provides both design considerations or guidelines for the amount of curvature of the feedback mirror 111, but also for the power level, shape and profile of the pump light and/or heat sinking in order to achieve a particular temperature profile to cause a thermal lensing effect to which the mirror 111 (or other optical mechanism, such as a polished and mirrored end facet (which, in some embodiments, has a concave external curvature that is convex from the point of view of the impinging laser beam inside the gain medium) on the gain medium 110, as described below for FIG. 2A) will compensate for the thermal lensing. This design then ensures that for a given power level (including very high pumping and laser power) the laser will maintain lasing instability, and thus reduce the number of modes supported and increase beam quality ($M^2$). In some embodiments, gain medium 110 has a curved feedback element 111 at one end and a flat feedback element 112 at the other. In some embodiments, the output beam is taken through feedback element 112, for example, a partially reflective mirror. In some embodiments, both feedback elements 111 and 112 are external optical elements, usually in close proximity to the gain medium, while in other embodiments, they are directly formed on the end facets of gain medium 110. In some embodiments, an electrically pumped pump laser 116 (e.g., a single laser diode bar or a stack of two or more laser diode bars) provides the optical pump power that is launched into a side (e.g., the top side) of gain medium 110 for optically pumped semiconductor laser (OPSL) 100, wherein gain medium 110 then outputs an output laser beam 199. In some embodiments, an optical element 117, such as a lens and/or aperture, is used to determine, at least in part, the shape and/or size of the launched pump light (this is called the "pump stripe" herein) that enters the gain medium 110. In some embodiments, laser 100 includes one or more heat sinks (e.g., a bottom heat sink 121), and one or more of these is in turn cooled by an active heat-transfer device such as a Stirling cycle cooler 120, or a thermoelectric Peltier-effect device in place of or in addition to the Stirling cycle cooler 120.

FIG. 1B is a perspective-view block diagram of a laser 101 that has been designed according to the present invention. Like numbered elements have substantially similar functions to those of FIG. 1A. Laser 101 also shows a pump-light mask and/or heatsink 122 and 123, and an optical element 117 in the form of a cylindrical lens used to define how much pump light is delivered where (e.g., the shape, length, width, and/or cross-section profile of the pump light launched into gain medium 110). In some embodiments, pump laser 116 includes a stack of pump lasers configured into a small form factor.

In one preferred embodiment, system 100 is located inside a vacuum dewar to minimize heat transfer from the outside environment to the system. In some embodiments, system 100 is affixed (e.g., soldered) into a temperature-controlled enclosure (sometimes called an "oven" although some embodiments use only a controlled cooler; e.g., some embodiments are operated close to liquid-nitrogen temperatures, i.e., around 77 K) whose internal temperature and temperature profile (i.e., the absolute temperature and the temperature differentials) are tightly controlled (e.g., by a controller that monitors one or more temperatures in the temperature-controlled enclosure and controls the amounts and/or locations of heating and/or cooling that are applied), in order to maintain more-constant lasing wavelength and output power, and to reduce mode hopping. In some embodiments, a plurality of temperature sensors monitor temperatures and various locations within the temperature-controlled enclosure of system 100 and feed temperature signals to controller 130, which in turn controls a plurality of cooling and/or heating elements (e.g., Stirling-cycle coolers, Peltier-effect heater-coolers, and/or the like) in order to maintain a tightly controlled profile of absolute temperatures and/or temperature differentials.

In some embodiments, the mask/heatsink portions 122 and 123 form a slit 125 between them that defines where the light goes (called the "pump stripe" herein) onto and into the lasing medium, and thus the thermal profile that causes the thermal lensing. The thermal lensing is a cause of the laser establishing lasing stability. One purpose of the present invention is to change the width of the pump stripe and or the curvature of one or more of the feedback mirrors on the end(s) of the lasing medium, in order to compensate for the thermal lensing, and thus establish good beam quality and single-mode lasing (e.g., by maintaining lasing instability through thermal-lensing compensation).

According to an embodiment by Ron Kaspi, the present invention is modified such that rather than using a constant-width pump stripe having parallel edges along the length of the signal path in the gain medium as described for the other embodiments of the invention, the width of the slit and/or pump stripe varies along its length in a manner that is iteratively derived by modeling and testing prototype laser devices. For example, in some such embodiments, one could taper the stripe such that, as measured in a direction perpendicular to the direction of propagation of the laser beam, the middle of the stripe is made wider than the ends, and the amount or rate of widening is iteratively increased until a desired amount of instability is achieved. In other such embodiments, one could taper the stripe such that, as measured in the direction perpendicular to the direction of propagation of the laser beam, the middle of the stripe is made narrower than the ends, and the amount of narrowing is iteratively changed until a desired amount of instability is achieved. In still other such embodiments, one could taper the stripe such that, as measured in the direction perpendicular to the direction of propagation of the laser beam, one end of the stripe is made narrower than the other end, and the amount of narrowing is iteratively changed until a desired amount of instability is achieved. The approaches disclosed here can still be used to guide the design even for these cases with non-rectangular pump stripes, for instance tapered or hour-glass shaped pump stripes. In these cases, an average stripe width (averaged over the length of the pumped region) can be calculated and used in the formulas of the present invention where the width of the pump stripe is called for.

In some embodiments, the tops of mask portions 122 and 123 are coated with a multi-layer dielectric mirror in order to minimize heat absorption in those portions on the gain medium that prevent pump light from entering the gain medium towards the outer edges. In some embodiments, the modeling includes the temperature effect of the light that strikes the mask on the gain medium and is absorbed there, such that the thermal profile prediction from the model includes the effect of light being partially absorbed by the mask, and in some embodiments, the absorptive qualities of the mask are adjusted up or down to achieve a particular profile. In some embodiments, the active gain region (e.g., a multiple-quantum-well (MQW) layered structure 114) is located towards the bottom heatsink 121, so it can be more effectively cooled by conduction to the heatsink 121 (since then the heat dissipated from structure 114 does not have to pass through the somewhat thermally resistive material 110). This is commonly referred to as an "epi-down" configuration. In some embodiments, a plurality of temperature sensors (e.g., thermistors) are embedded (e.g., in holes in a Cartesian grid pattern) within heatsink 121, in order to closely monitor the temperature profile of the OPSL gain medium in the epi-down configuration (locating temperature sensors in heatsink 121 can also be used to monitor the temperature profile of the OPSL gain medium in the epi-up configuration shown in FIG. 1D, but may have a slower response time due to the lag in heat flow through that gain medium). In some embodiments, the devices of the present invention are cooled to the maximum extent practible (e.g., by liquid nitrogen, in some embodiments).

In some embodiments, the stripe width is primarily or even entirely established by focussing optics and/or one or more apertures in the pump-light path between the pump source and the OPSL, and the mask sections 122 and 123 are omitted or play a secondary role in establishing the stripe width. In some such embodiments, the stripe width is varied dynamically and/or iteratively using the focussing optics between the pump source and the OPSL. In some embodiments, controller 122 dynamically controls the focussing and/or aperture size based on monitoring signals from temperature sensors and/or beam-quality sensors.

Some embodiments of this method of the present invention use only focussing elements and allow more of the pump light to be used, since rather than using a mask on the OPSL chip or an aperture between the pump source and the OPSL, both of which block or reflect pump light to establish the stripe width and thus waste the light that falls outside of the desired stripe, the method uses focussing optics (e.g., a cylindrical lens) to establish the stripe width. In some such embodiments, and the width of the stripe is iteratively changed by moving the position(s) of the pump source, the OPSL chip, and/or the focussing optics until a desired amount of instability and thus a good beam quality is achieved. In some such embodiments, a constant-width stripe is established (and its width then iteratively changed) by the focussing optics, while in other embodiments, different shapes (e.g., tapered or bow-tie shapes) for the pump stripe are formed by the focussing optics.

FIG. 1C is a block diagram of a laser gain medium 140 that has been designed according to the present invention. Gain medium 140 includes two concave end facets 118 and 119 that each compensate for a portion of the thermal lensing due to the temperature profile, which can effect the shape of the mode profile of the OPSL laser beam (e.g., shown as a purely hypothetical shape 141) both inside and outside the OPSL.

FIG. 1D is a block diagram of a laser 102 that has been designed according to the present invention. Like numbered elements have substantially similar functions to those of FIG. 1B. Laser 102 also shows, as in some embodiments, that the active gain region (e.g., a multiple-quantum-well (MQW) layered structure 115) is located towards the top heatsink portions 122 and 123 (called an "epi-up" configuration), so its temperature profile (both side-to-side and end-to-end) can be more readily and/or effectively configured to a particular shape by changing the top mask than is possible in some embodiments of a laser (such as system 101 of FIG. 1B) where the active region is nearer to the bottom heatsink 121, where light may disperse sideways under the mask portions.

Figure 2C:
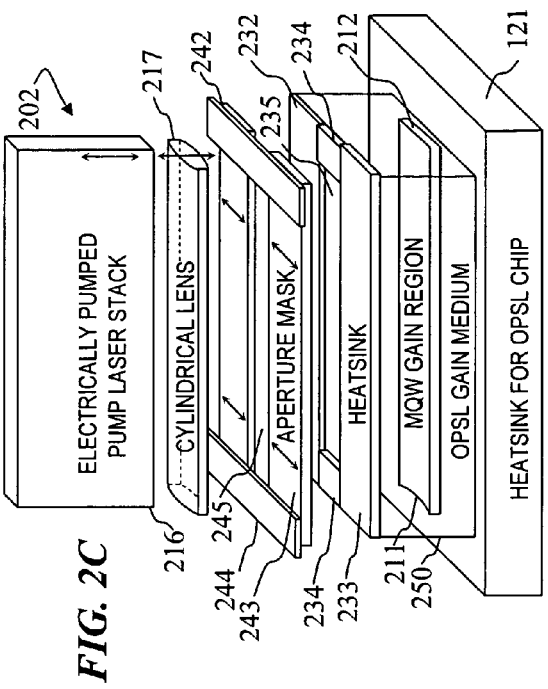
FIG. 2C is a block diagram of a laser 202 that has been designed according to the present invention.
Figure 2A:
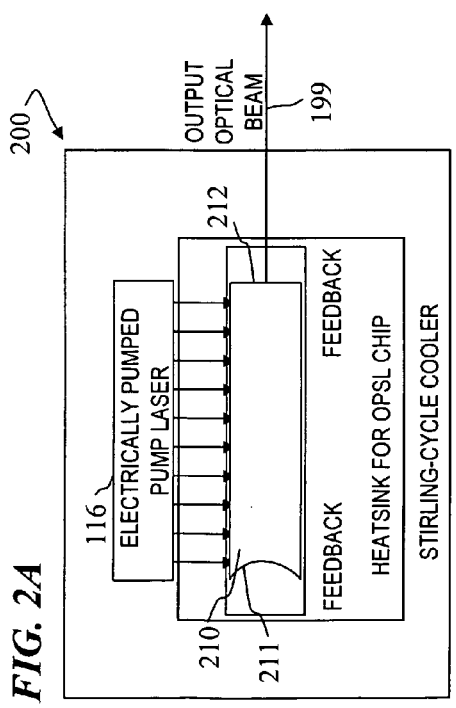
FIG. 2A is a block diagram of a laser 200 that has been designed according to the present invention.

FIG. 2A is a block diagram of a laser 200 that has been designed according to the present invention. Like numbered elements have substantially similar functions to those of FIG. 1A. Laser 200 also shows, as in some embodiments, that active gain medium 210 (e.g., including a multiple-quantum-well (MQW) layered structure in some embodiments) has its optical feedback elements 211 and 212 formed directly on ends of gain medium 210 (e.g., in some embodiments, facet 211 is a convex (viewed from inside the laser cavity) facet formed by polishing using a rotary bit (e.g., using a Dremel®-type tool) to form the desired radius of curvature as determined according to the design methods described below, and then coated to form a highly-reflective internal surface, and 212 is a partially reflective flat surface).

Figure 2B:
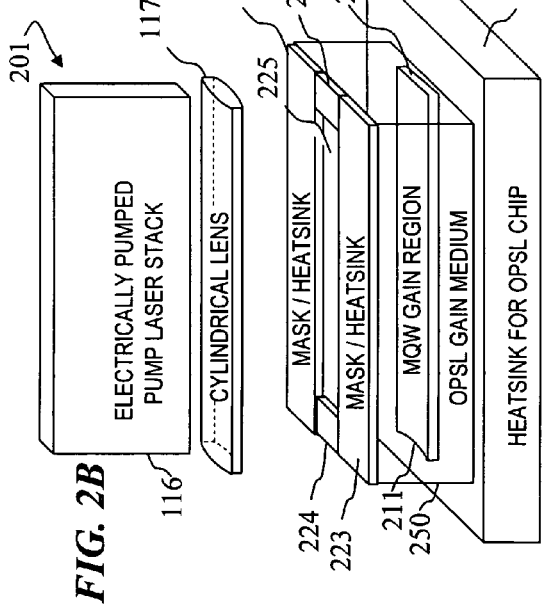
FIG. 2B is a block diagram of a laser 201 that has been designed according to the present invention.

FIG. 2B is a block diagram of a laser 201 that has been designed according to the present invention. Like-numbered elements have substantially similar functions to those of FIG. 2A and FIG. 1B. Laser 201 also shows, as in some embodiments, that the top mask includes side portions 222 and 223, as well as one or more end portions 224 that is used to terminate slit 225 short of the ends (i.e., 211 and 212) of the gain medium 250, to further shape and control the temperature profile as well as the pumped area of the gain medium 250.

FIG. 2C is a block diagram of a laser 202 that has been designed according to the present invention. Like-numbered elements have substantially similar functions to those of FIG. 2A and FIG. 1B. In some embodiments, laser 202 uses and adjustable optical system that includes cylindrical lens 217 that is controllably movable up and down relative to OPSL gain medium 250 (along with the controllably movable pump stack 216) in order to focus the pump light in different-width pump stripes onto OPSL gain medium 250. Laser 202 also shows, as in some embodiments, an aperture 245 surrounded by one or more masking elements including side portions 242 and 243 used to define the width of the pump stripe, and optionally one or more end portions 244 that are used to optionally define the length of the pump stripe short of the ends (i.e., 211 and 212) of the gain medium 250, to further control the temperature profile and pumped area of the gain medium 250. Laser 202 also shows, as in some embodiments, that the top heatsink includes side portions 232 and 233, and optionally one or more end portions 234 that are used to terminate slit 235 short of the ends (i.e., 211 and 212) of the gain medium 250, to further control the temperature profile of the gain medium 250. In some embodiments, the aperture 245 and lens 217 entirely or primarily define the pump stripe profile, such that heatsink portions 233, 234, 235 are performing cooling functions but not masking functions. In some embodiments, heatsink portions 233, 234, 235 are omitted.

Quick Summary of the Thermal Lensing Analysis for OPSL's

A thermal gradient in the transverse temperature profile of a solid-state gain medium (e.g., one used for a laser) sets up a gradient in the transverse index-of-refraction profile (a "thermal lens" or "duct"). The strength of this lens depends only on the variation in the temperature ($\Delta T$) across the transverse direction, but generally not the overall background temperature.

Figure 4:
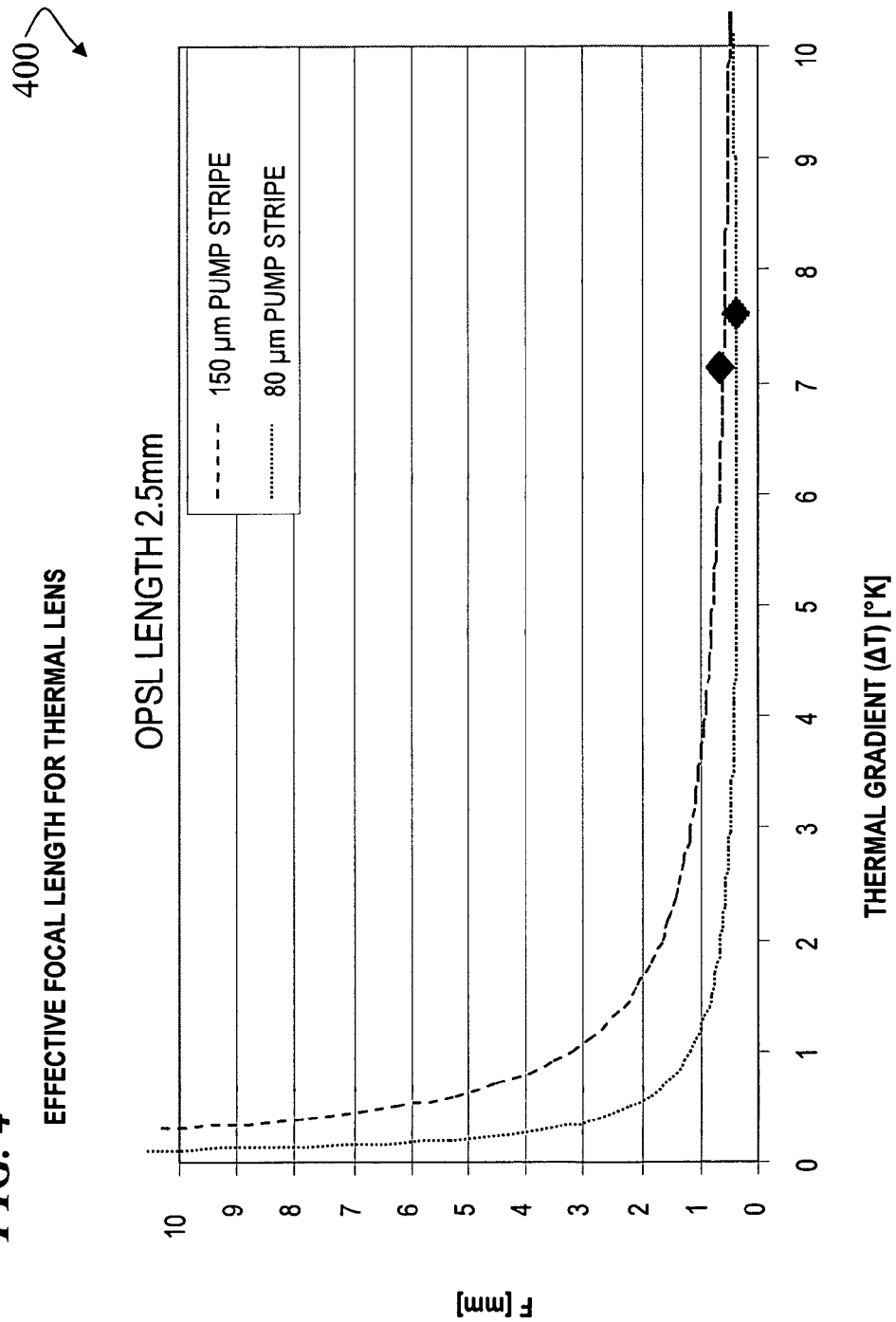
FIG. 4 shows a graph depicting effective focal length as a function of thermal gradient for two pump-stripe widths, a narrower 80-micron-wide pump stripe and a wider 150-micron-wide pump stripe.

FIG. 4 shows a graph depicting effective focal length as a function of thermal gradient for two pump-stripe widths, a narrower 80-micron-wide pump stripe and a wider 150-micron-wide pump stripe. For the pump geometry used for some embodiments of the present invention, even a small thermal gradient will create a strong lens. In some embodiments, our operating conditions (marked on the graph) have a focal length of <1 mm:

Analysis of Gaussian and parabolic profile ducts is a standard technique, found for instance in Anthony E. Siegman's *Lasers*, University Science Books, Sausalito, Calif., 1986. In a Fabry-Perot cavity, where the wavefronts are flat, there is a simple formula for the size of the fundamental mode. Beam quality can be estimated by the number of times the fundamental mode fits in the emitting aperture, or $M^2 \sim N$, the number of transverse modes.

For a parabolic duct, $$M^2 \approx a \cdot \sqrt{\Delta T} \cdot \frac{\pi}{\sqrt{2}\, \lambda_0} \cdot \sqrt{n \cdot \frac{dn}{dT}}$$

For a Gaussian duct, $$M^2 \approx a \cdot \sqrt{\Delta T} \cdot \frac{\pi}{\lambda_0} \cdot \sqrt{n \cdot \frac{dn}{dT}}$$

where a is the full-width $1/e^2$ pump stripe width, $\Delta T$ is the thermal gradient across the pump stripe, n is the index of refraction in the OPSL and dn/dT is the temperature dependence of the index of refraction.

In some embodiments, the two main strategies for improving beam quality are to decrease the pump stripe width, a, and/or to decrease the thermal gradient $\Delta T$. The thermal gradient is affected by many factors, including pump power, pump-pulse duration, pump-stripe width, chip length, the material(s) conducting heat away from the immediate area of the pumped region, transverse pump profile, and the thermal efficiency of the OPSL. (In some embodiments, the curvature of the thermal profile depends upon the characteristics of all of the material through which heat flows from the rather tiny gain region and/or the regions onto which pump light is projected. So, in some embodiments, one uses different material-thermal constants for the epi-up versus epi-down configurations.) In the end, for the Fabry-Perot cavity, the best improvement to beam quality comes from using a narrower pump stripe. Although the narrower pump stripe increases the thermal gradient $\Delta T$, it is more than compensated by the decrease in a. Unfortunately, decreasing a causes the overall device temperature to rise, which leads to a decrease in optical efficiency. So the narrower pump stripe is useful in terms of improving beam quality, but degrades overall system performance. $\Delta T$ is smaller for the wider pump stripe, but the increase in the effective resonator aperture size a allows more transverse lasing modes to "fit" in the cavity, resulting in poorer beam quality.

Figure 5:
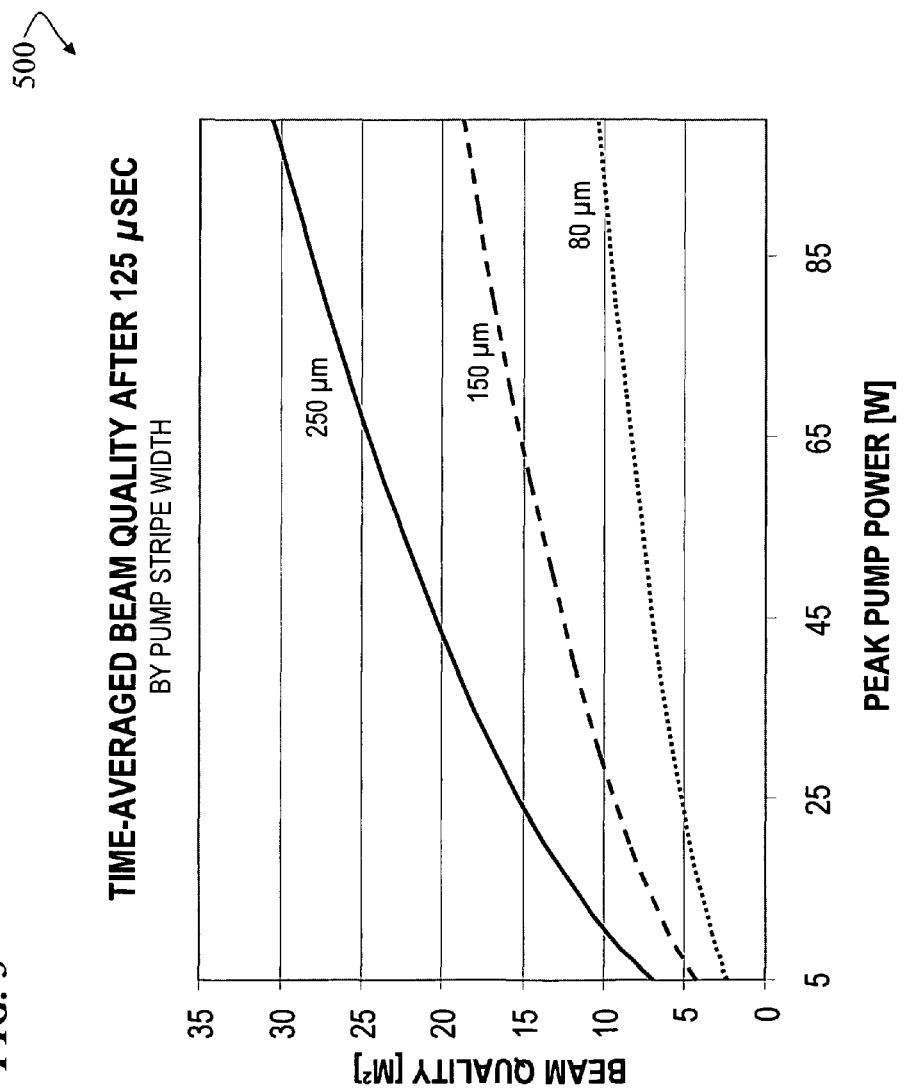
FIG. 5 shows a graph depicting time-averaged beam quality as a function of peak pump power for three pump-stripe widths.

FIG. 5 shows a graph depicting time-averaged beam quality (the value of $M^2$, where lower values of $M^2$ represent better beam quality) for a Fabry-Perot cavity with flat reflective surfaces after 125 microseconds of pumping as a function of peak pump power for three pump-stripe widths, a narrower 80-micron-wide pump stripe, a medium 150-micron-wide pump stripe, and a wider 250-micron-wide pump stripe. In the example shown, using an 80-micron wide pump stripe and a peak pump power of 5 Watts gave $M^2$ of about 2.5, while using a peak pump power of 90 Watts gave $M^2$ of about 10. However, using a 250-micron wide pump stripe and a peak pump power of 5 Watts gave $M^2$ of about 7, while using a peak pump power of 90 Watts gave $M^2$ of about 28.

From the formulas for $M^2$ in the Fabry-Perot, we can see that there is no sharp break where a small change in stripe width makes a substantial change in beam quality. This is not the case for an unstable resonator.

FIG. 3 shows an unstable-resonator geometry used in some embodiments. The length of the pump stripe is labeled L, its width is a, and the radius of curvature of the concave end facet is R. For the "curved-flat facet cavity", classic textbook analysis is only available in the form of ABCD matrices for parabolic ducts. This will underestimate the effect of thermal lensing for some pump geometries. For example, a Gaussian profile pump will create a stronger Gaussian-profile thermal duct. More detailed analysis that could consider a Gaussian thermal profile requires a full beam-propagation model of the laser cavity. The parabolic duct approximation describes an appropriate design point for use in designing a different pumping scheme that will operate as a true unstable resonator.

In some embodiments, using analysis for a parabolic thermal profile, we calculate the effective focal length of the thermal lens as a function of the thermal gradient. The effective focal power of the thermal lens is markedly stronger in the narrower pump stripe.

Figure 6:
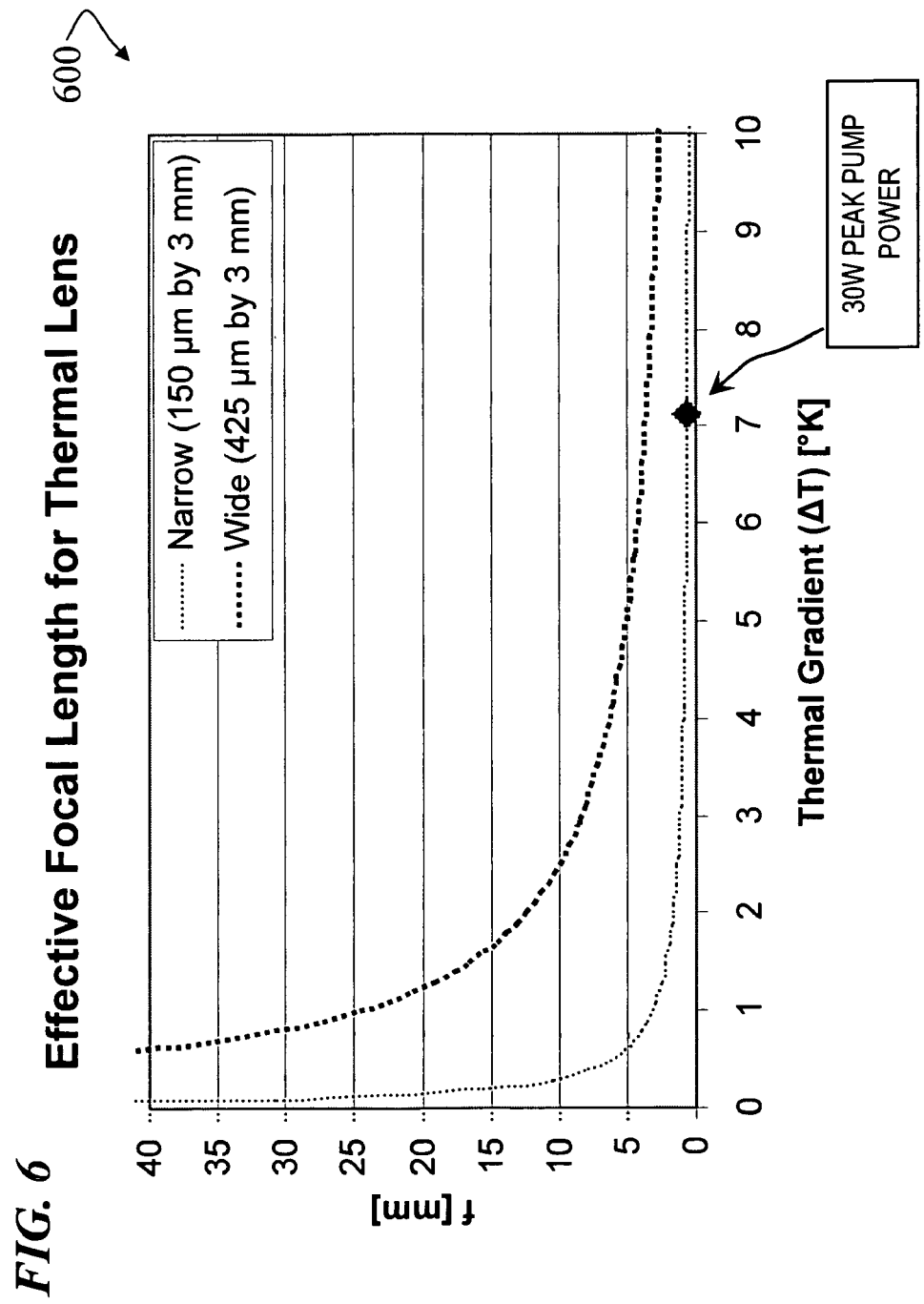
FIG. 6 shows a graph depicting effective focal length as a function of thermal gradient for two pump-stripe widths.

FIG. 6 shows a graph 600 depicting effective focal length as a function of thermal gradient for two pump-stripe widths, a narrower 150-micron-wide pump stripe and a wider 425-micron-wide pump stripe (narrower=150 μm×3 mm, and wider=425 μm×3 mm).

In the curved-flat faced cavity, the pump stripe width also affects whether the cavity operates as a classical unstable resonator. The geometry is such that for a wider stripe, the effective focal length is longer and the cavity also has a larger range of potential operation as a classical unstable resonator, as shown in FIG. 7.

Figure 7:
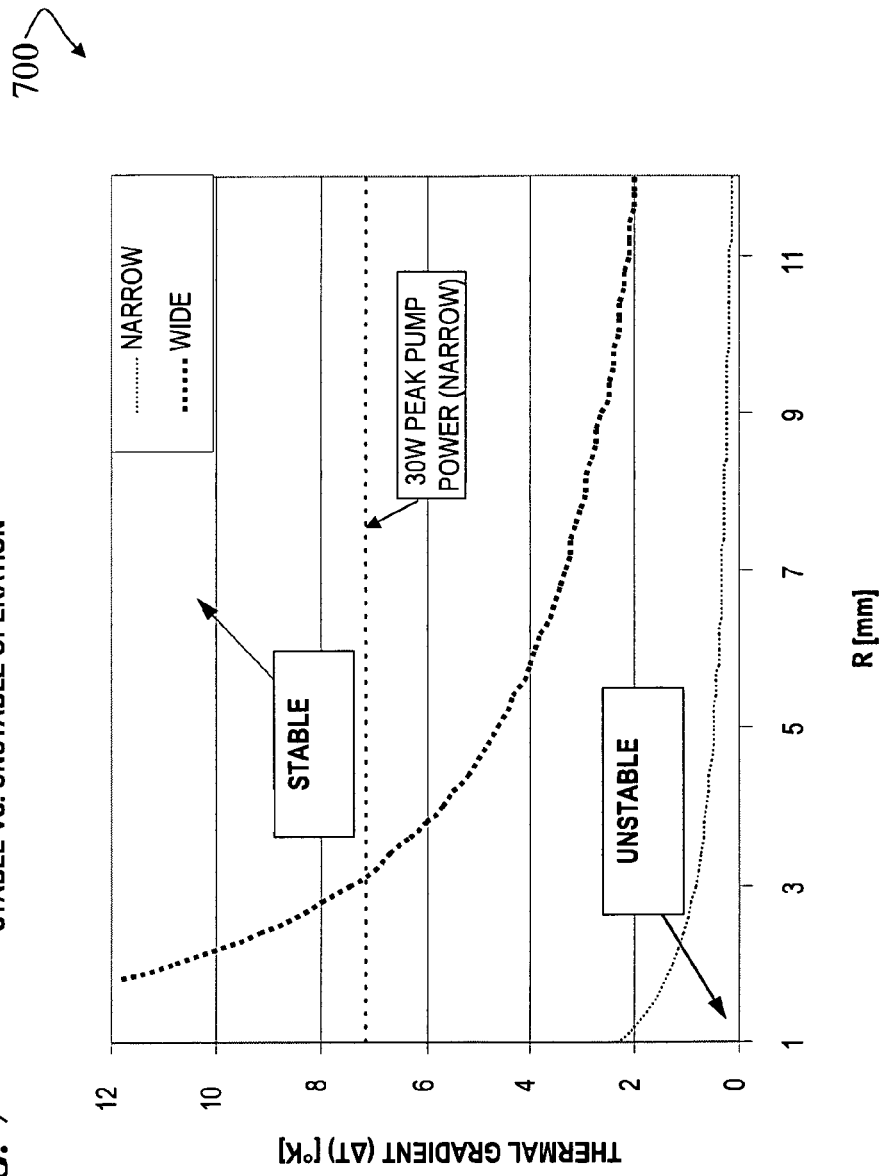
FIG. 7 shows a graph 700 depicting a region of stable operation towards the upper right and a region of more desirable unstable operation towards the lower left.

FIG. 7 shows a graph 700 depicting a region of stable operation towards the upper right and a region of more desirable unstable operation towards the lower left (in terms of thermal gradient and radius of curvature of the end facet).

In the region above the curve, the cavity will operate as a stable resonator. For the narrower pump stripe, there is a much smaller range of thermal gradients in which the cavity will operate as a classical unstable resonator. The narrower pump stripe also leads to higher transverse thermal gradients, making it difficult to achieve unstable operation with the narrower pump stripe.

A specific prescription exists for the minimum pump stripe required for unstable operation, based on the stripe geometry and thermal gradient ΔT. The cavity will operate as a classical unstable resonator as long as:

$$\cos(2L\gamma) + \frac{\sin(2L\gamma)}{nR\gamma} \geq 1 \quad (1)$$

where L is the OPSL length, R is the radius of curvature of the back facet and $$\gamma \approx \frac{a}{2} \cdot \frac{1}{\sqrt{n \cdot \frac{dn}{dT} \cdot \Delta T}} \quad (2)$$

In some embodiments, this gives us the following procedure for finding the minimum required pump stripe width. (This is an alternative design approach. This procedure is reasonable if one already has an OPSL chip in hand, so that L, R, and n are known from the chip, and one can solve equation (1) for a limit on gamma (γ). Then one can adjust the stripe width a, and do a finite-element analysis to calculate ΔT, and perhaps change a again, and again re-calculate ΔT.

Step (1) Use the material and cavity parameters L, n and R to solve equation (1) for γ.

Step (2) Use finite-element analysis to calculate ΔT for the desired pumping conditions Step (3) Use these values of γ and ΔT, along with the material parameters n and dn/dT to solve equation (2) for a, the minimum stripe width needed for unstable operation.

Step (4) Iterate if needed: after changing the stripe width a, it may be necessary to go back to Step (2) and re-run the finite-element analysis using the new pump stripe width.

In the following discussion is a short derivation of a "rule" for designing Optically-Pumped Semiconductor Lasers (OPSLs) with unstable resonators, such that they will produce a high beam quality (a beam having low $M^2$).

In earlier work at low to moderate operating power in devices with flat-flat stable resonators, it was found that the best beam quality was achieved by making the width of the excited stripe on the semiconductor material as narrow as practical. (The thermal gradients produced by the pumping produce a positive thermal lens, making the flat-flat resonator stable.) The narrow pump stripe produced the best beam quality because the number of modes in the resonator scales as the area of the gain region, so to limit the number of higher-order modes, smaller pumped regions are favored. Still, as pump power was increased, the beam quality degraded rapidly.

To solve the beam quality at high power, the approach of using an unstable resonator was attempted. Unstable resonators are well-known solutions to produce good beam quality in many types of high-power lasers, including solid-state lasers. The unstable resonator is produced by replacing the flat high reflecting surface at the back of the laser cavity (the back surface of the semiconductor laser chip) with a curved external reflective surface, its convex side toward the gain material (or a mirrored facet formed in the gain material and having a concave surface). But it was discovered that although the unstable resonator produced good beam quality at low to moderate powers, at high pump power the beam quality degraded nevertheless. Attempts to improve the beam quality by using a narrower pump stripe were fruitless.

Experts in the physics of optical semiconductor devices conjectured that the degraded beam quality was due to filamentation and other nonlinear and chaotic effects in the semiconductor material, and could not readily be compensated for.

The inventors of the present invention developed a thermo-optical model that explains the observations, and can be used as a design rule for improving beam quality at high powers in these types of OPSLs. At high pump powers, a very strong thermal lens is created in the lasing semiconductor material. This thermal lens can become so strong, that the positive thermal lens overwhelms the negative curvature of the back mirror in the laser cavity, and the resonator becomes stable. The stable resonator then supports many transverse modes, leading to poor beam quality. The key is to keep the (positive) optical power of the thermal lens from overwhelming the (negative) power of the end mirror in the cavity, so the resonator remains unstable. The strength of the thermal lens depends on the pumping conditions and the material thermal characteristics, so it is possible to define a quantitative design rule that will lead to a high-beam-quality, high-power OPSL.

Below is a derivation that shows the relationship of the various factors that determine the stability of the cavity, and therefore the limitations that will give good or bad beam quality. Briefly, the mathematical relation is based upon knowing the shape of the thermal distribution obtained for an infinitesimally narrow heated stripe on the surface of the material. This can be written analytically. Then if one multiplies that function by the shape of the pumping distribution and integrates over the width of the distribution, one can get the figure for ΔT across the beam. In some embodiments, the function is the "Green's function" for the problem—one takes the Green's function that describes what temperature distribution is obtained for an infinitesimally narrow line-source of heat, and convolves and/or integrates it with the actual heating distribution.

The following provides a heuristic method for choosing stripe width, pump power, and the like, where the simplifying assumption of uniform pumping across the stripe width is made (note that the term "convex mirror" is convex from the viewpoint of the resonator beam reflected from the mirror, such that when an external mirror is used, that mirror has a convex shape, but when the mirror is formed directly on an end facet of the semiconductor chip, that facet is concave when viewed from outside the chip, but is still "convex" from the viewpoint of the beam):

a=stripe width (in units of length)

L=chip length (in units of length)

R=convex mirror radius of curvature (in units of length)

n=index of refraction dn/dT=temperature dependence of the index of refraction (in units of temperature$^{-1}$)

P=incident pump power

ΔT=temperature difference across stripe (maximum−minimum) (in units of temperature)

η=optical-to-optical efficiency $t_{pulse}$=Pump pulse length (in units of time)

Thermal Properties of the material conducting heat away from the immediate area of the pumped region (considered primarily or only heatsink material for epi-down, or primarily or only OPSL gain medium material for epi-up):

k=thermal conductivity (in units of power)/(units of length temperature)

$$\alpha = \text{thermal diffusivity} = \frac{k}{\rho c_p}$$

where $\rho$ is the density and $c_p$ is the specific heat

The cavity will operate as a classic unstable resonator if $\gamma$ satisfies equation (3):

$$\cos(2L\gamma) + \frac{\sin(2L\gamma)}{nR\gamma} \geq 1 \text{ where} \quad (3)$$

$$\gamma \approx \frac{2}{a} \cdot \sqrt{\frac{2 \cdot \frac{dn}{dT} \cdot \Delta T}{n}}$$

For typical operating conditions, of some embodiments with a uniform pump stripe, this is essentially the same as satisfying $$a^2 \geq \frac{4RP(1-\eta)}{\pi k} \cdot \frac{dn}{dT} \cdot \exp\left(-\frac{a^2}{16\alpha t_{pulse}}\right)$$

The quantity $a^2/16\alpha$ corresponds to a characteristic time for the OPSL device to approach a steady-state thermal distribution. For typical operating conditions, this characteristic $a^2/16\alpha$ is significantly shorter (thermal equilibration is much faster) than the pulse duration $t_{pulse}$, so the exponential term approaches the value 1 (one), particularly toward the end of the laser pulse when the thermal lens becomes strongest. Then the design condition can be closely approximated as $$a^2 \geq \frac{4RP(1-\eta)}{\pi k} \cdot \frac{dn}{dT}$$

This design rule is applicable for uniformly-pumped OPSLs.

In some other embodiments, a simplified method is used, wherein for the present invention's regions of interest, this is basically the same as satisfying the equation:

$$\boxed{a^2 \geq 8LR \cdot \frac{dn}{dT} \cdot \Delta T}$$

Now for this simplified method, one just needs to estimate $\Delta T$ in terms of a, P, L, and other material properties. The flux on the surface is proportional to:

$$\text{Flux} \propto \frac{P \cdot (1-\eta)}{L \cdot a \cdot k}$$

Broadly speaking for this simplified method:

$$\Delta T \propto \frac{P \cdot (1-\eta)}{L \cdot a \cdot (\alpha \cdot k)}$$

So one can say, for this simplified method, more or less, $$\Delta T = \kappa \frac{P(1-\eta)}{(\alpha k)La},$$

where $\kappa$ is our proportionality constant (which, in some embodiments, is empirically derived or derived from the design-condition inequality at the end of paragraph [0062] above) and the important inequality becomes:

$$a^3 \geq 8\kappa \cdot \frac{RP(1-\eta)}{\alpha k} \cdot \frac{dn}{dT}$$

A more complex approach uses the Green's function for the thermal diffusion in the submount material. The advantage of the Green's function approach is it allows the proper resonator and operating parameters to be determined for pumping stripes whose power density is not uniform across the width of the pump stripe. We can define the following factors:

T=emitter temperature
x=position transverse to the laser axis, measured from center of emitter
q''(x)=absorbed heat flux due to pump illumination, as a function of position across pump stripe
k=thermal conductivity of the material conducting heat away from the immediate area of the pumped region
Ei(x)=the exponential integral function
$\alpha$=thermal diffusivity of the material conducting heat away from the immediate area of the pumped region The dominant factor in determining the thermal lens in the OPSL is the second derivative of the temperature distribution in the laser gain medium. The second derivative of the temperature distribution in the transverse (x) direction is:

$$\frac{\partial^2 T}{\partial x^2} = -\frac{\partial^2}{\partial x^2} \int_{-\infty}^{\infty} \frac{q''(\xi)}{2\pi k} Ei\left[-\frac{(x-\xi)^2}{4\alpha t}\right] d\xi$$

Given the OPSL physical properties:
L=chip length (in units of length)
R=UR (unstable resonator) convex mirror radius of curvature (in units of length)
n=index of refraction
dn/dT=temperature dependence of the index of refraction (in units of temperature$^{-1}$)

The following inequality must be satisfied in order for the OPSL to operate as an unstable resonator:

$$LR \cdot \frac{dn}{dT} \cdot \frac{\partial^2 T}{\partial x^2} \leq 1$$

In this embodiment of the invention, the pumping distribution (q''(x)) can be measured directly with power or energy meter capable of fine spatial resolution, or approximated by some appropriate function. Then the factor $$\frac{\partial^2 T}{\partial x^2}$$

can be calculated numerically (typically by using a computer program). Then L and R can be chosen to satisfy the required inequality.

In some embodiments, a Fabry-Perot analysis motivates why one would look at thermal lensing in the unstable resonator. In some embodiments, the formula for $M^2$ in terms of a and $\Delta T$ is used to design a pumping scheme. Since that approach would lead to a narrower stripe, and consequently a higher overall device temperature, this leads to many trade-offs in terms of efficiency, but is useful for lasers built using highly efficient semiconductors and very powerful cryostats.

In some embodiments, the laser gain medium is GaSb, and the index of refraction, n, and temperature sensitivity for n, respectively, are n=3.8, and $dn/dT=3.06\times10^{-4}$ for GaSb.

In some embodiments, the present invention describes improved (thermal-lensing-compensated) configurations for pumping the unstable resonators. In some embodiments, the OPSL pumping parameter space is as follows:

| Parameter | value currently used for some embodiments | value used for other embodiments |
|---|---|---|
| Peak Pump Power | 30 to 60 W (watts) | to 100 W or more |
| Pump Width | 80 to 500 µm (microseconds) | to 1 mm or more |
| Pump Duration | 50 to 250 µs (microns) | 1 µs to continuous |
| OPSL length | 2-4 mm | to 6 mm or m |
| Temperature gradient (across pumped region) | $\Delta T$ = 40-60 C. | 20-70 C. or wider (wider meaning a higher upper bound and/or smaller lower bound) (although other embodiments use other ways to quantify the thermal resistance) |

In some embodiments, the OPSL design invention includes providing a curved facet on at least one end of the OPSL for better beam quality, wherein the curvature of the facet is designed by modeling and meeting the equations above. In some embodiments, improved beam quality is achieved in the OPSL by squaring the cross-sectional shape of pump intensity. In some embodiments, the present invention provides a method that achieves near-diffraction-limited beam quality and optimizes brightness in high-power flat and/or curved-facet OPSLs by choosing pump-stripe width and shape, the laser's pump duration and/or OPSL length. In some embodiments, the parameter space is used where the high brightness is achieved: pump power: 20 to 100 W, pump width: 80 µm to 100 mm, OPSL length 2-6 mm. In some such embodiments, 80 µm is too narrow for good beam quality with curved-facet resonator, and other optical effects are used to obtain beam quality.

In some embodiments, the present invention provides a method that includes providing an optically pumped solid-state-laser (OPSSL) design; modeling a heat flow and a temperature profile of the OPSSL design; adjusting the OPSSL design based on the modeling to compensate for thermal lensing in order to maintain lasing instability; and fabricating a first optically pumped solid-state laser based on the adjusted OPSSL design.

Some embodiments further include testing the first OPSSL to take measurements of its instability, its beam quality, and one or more of its heat flow and its temperature profile; re-adjusting the OPSSL design based on the measurements to better compensate for thermal lensing in order to maintain lasing instability; and fabricating a second optically pumped solid-state laser based on the re-adjusted OPSSL design.

In some embodiments, the optically pumped solid-state laser is an optically pumped semiconductor laser (OPSL). In some embodiments, the present invention provides a laser made by such a method.

In some embodiments, the present invention provides an optically pumped solid-state laser that maintains lasing instability even when pumped with more than three (3) watts of pump power and pump-pulse durations of 100 microseconds or more (i.e., pulses long enough for the device to approach thermal equilibrium and/or the temperature distributions to have constant curvature even though the absolute temperature might still be rising for longer pump times) and thus pumped hard enough (e.g., pumped with enough intensity for enough time) to cause thermal lensing. In some embodiments, the present invention provides an optically pumped solid-state laser that maintains lasing instability even when pumped with pump power of between 5 and 10 watts of pump power, between 10 and 20 watts of pump power, between 20 and 30 watts of pump power, between 30 and 40 watts of pump power, between 40 and 50 watts of pump power, between 50 and 60 watts of pump power, between 60 and 70 watts of pump power, between 70 and 80 watts of pump power, between 80 and 90 watts of pump power, between 90 and 100 watts of pump power, and/or over 100 watts of pump power.

In some embodiments, the present invention provides an optically pumped solid-state laser that maintains lasing instability even when pumped with pump power of over about 1 watt of pump power, over about 2 watts of pump power, over about 3 watts of pump power, over about 4 watts of pump power, over about 5 watts of pump power, over about 6 watts of pump power, over about 7 watts of pump power, over about 8 watts of pump power, over about 9 watts of pump power, over about 10 watts of pump power, over about 20 watts of pump power, over about 30 watts of pump power, over about 40 watts of pump power, over about 50 watts of pump power, over about 60 watts of pump power, over about 70 watts of pump power, over about 80 watts of pump power, over about 90 watts of pump power, over about 100 watts of pump power, over about 120 watts of pump power, over about 140 watts of pump power, over about 160 watts of pump power, over about 180 watts of pump power, over about 200 watts of pump power, over about 300 watts of pump power, over about 400 watts of pump power, or over about 500 watts of pump power.

In some embodiments, the present invention provides a method that includes providing an optically pumped solid-state laser design; fabricating a first optically pumped solid-state laser (OPSSL) based on the optically pumped solid-state laser design; testing the first OPSSL to measure its instability, and one or more of its heat flow and its temperature profile; adjusting the optically pumped solid-state laser design based on the measurements to compensate for thermal lensing in order to maintain lasing instability; and fabricating a second optically pumped solid-state laser (OPSSL) based on the adjusted optically pumped solid-state laser design.

In some embodiments, the present invention provides a method for producing an optically-pumped unstable-resonator solid-state laser that includes choosing pumping characteristics including stripe width and power level of a pumped region of the optically-pumped unstable-resonator solid-state laser, and based upon these pumping characteristics, building the optically-pumped unstable-resonator semiconductor laser with a resonator negative radius of curvature R such that the inequality $$a^2 \geq \frac{4RP(1-\eta)}{\pi k} \cdot \frac{dn}{dT}$$

is satisfied by the laser, wherein
a=stripe width (in units of length),
R=convex mirror radius of curvature (in the units of length),
P=incident pump power (in units of power),
η=optical-to-optical efficiency,
k=thermal conductivity of the material conducting heat away from the immediate area of the pumped region (in units of power)/(units of length temperature), and
n=index of refraction and
dn/dT=temperature dependence of the index of refraction (in units of temperature$^{-1}$).
In some such embodiments, the optically-pumped solid-state laser is an optically-pumped semiconductor laser.

In some embodiments, the present invention provides a method that includes operating an unstable-resonator semiconductor laser under pumping conditions chosen such that the inequality $$a^2 \geq \frac{4RP(1-\eta)}{\pi k} \cdot \frac{dn}{dT}$$

is satisfied by the laser, wherein
a=stripe width (in units of length),
R=convex mirror radius of curvature (in the units of length),
P=incident pump power (in units of power),
η=optical-to-optical efficiency,
k=thermal conductivity (in units of power)/(units of length temperature), and
n=index of refraction and dn/dT=temperature dependence of the index of refraction (in units of temperature$^{-1}$).

In some embodiments, the above methods include attaching a metal heat sink to a first side of the laser, the heat sink having a slit modified based on the method; and providing a transparent (e.g., sapphire) heat-sink covering and an optical pump configured to pump through the slit in the heatsink.

In some embodiments, the making of the laser includes attaching a metal heat sink to a first side of the laser, the heat sink having a slit modified based on the modeling; covering the heat sink with a transparent (e.g., sapphire) heat-sink covering; and optically pumping the laser through the slit in the heatsink.

In some embodiments, the making of the laser includes attaching a metal heat sink to a first side of the laser, the heat sink having a slit modified based on the modeling; attaching a metal heat sink to a second side of the laser; and optically pumping the laser through the slit in the heatsink.

In some embodiments, the making of the laser includes attaching a metal heat sink to a first side of the laser, the heat sink having a slit modified based on the modeling; attaching a metal heat sink to a second side of the laser; covering the heat sink with a transparent (e.g., sapphire) heat-sink covering; and optically pumping the laser through the slit in the heatsink.

In some embodiments, the making of the laser includes attaching a metal heat sink to a first side of the laser, the heat sink having a cross section modified based on the modeling to obtain a temperature profile that achieves a desired thermal lensing.

In some embodiments, the making of the laser includes attaching a metal heat sink to a first side of the laser, the heat sink having an extended lateral extent modified based on the modeling to obtain a temperature profile that achieves a desired thermal lensing.

In some embodiments, the making of the laser includes attaching a metal heat sink to a first side of the laser, the heat sink having a slit modified based on the modeling, wherein a narrow slit is used for flat or cleaved mirrors, and a wider slit is used for curved mirrors.

In some embodiments, the making of the laser includes attaching a metal heat sink to a first side of the laser, the heat sink having a slit modified based on the modeling, wherein the slit provides a Gaussian intensity cross section of pump inlet light.

In some embodiments, the making of the laser includes attaching a metal heat sink to a first side of the laser, the heat sink having a slit modified based on the modeling, wherein the slit provides a parabolic intensity cross section of pump inlet light.

In some embodiments, the making of the laser includes attaching a metal heat sink to a first side of the laser, the heat sink having a slit modified based on the modeling, wherein the slit provides a flat-top intensity cross section of pump inlet light.

In some embodiments, the making of the laser includes attaching a metal heat sink to a first side of the laser, the heat sink having a slit modified based on the modeling, wherein a width of the slit is adjusted to obtain a temperature profile that achieves the desired thermal lensing.

In some embodiments, the making of the laser includes attaching a metal heat sink to a first side of the laser, the heat sink having a slit modified based on the modeling, wherein a width of the slit is varied over its length to obtain a temperature profile that achieves the desired thermal lensing.

In some embodiments, the making of the laser includes attaching a metal heat sink to a first side of the laser, the heat sink having a slit modified based on the modeling, wherein the slit closed or ended at a distance from a mirror end of the laser's resonator cavity to obtain a temperature profile that achieves the desired thermal lensing.

In some embodiments, the making of the laser includes attaching a metal heat sink to a first side of the laser, the heat sink having a slit modified based on the modeling, wherein the slit closed or ended at a distance from a mirror end of the laser's resonator cavity to obtain a temperature profile that achieves the desired thermal lensing.

In some embodiments, the making of the laser includes forming a mirror on the laser that defines a slit and reflects and/or rejects pump light outside the desired profile.

In some embodiments, the making of the laser includes providing a mirror external to the laser's gain medium, wherein the external mirror provides at least some compensation for thermal lensing to maintain laser beam quality.

In some embodiments, the present invention provides a method that includes modeling operation of a semiconductor laser; and predicting beam quality based on thermal lensing, heat flow, and/or temperature profile. Some embodiments further include adjusting a feedback parameter; and iterating the first three steps in order to maximize beam quality. Some embodiments further include adjusting a heat flow parameter; and iterating the first three steps in order to maximize beam quality.

Some embodiments further include adjusting an optical-pump-beam shape; and iterating the first three steps in order to maximize beam quality. Some embodiments further include adjusting a heat-sink shape; and iterating the first three steps in order to maximize beam quality. In some embodiments, the present invention provides a computer-readable medium (e.g., CDROM) having software that, when run on a suitably programmed information processor performs one or more of the methods described above.

In some embodiments, the present invention provides a computer programmed to perform one or more of the methods above.

In some embodiments, the present invention provides a computer-readable medium having software that, when run on a suitably programmed information processor performs a method that includes inputting an optically pumped solid-state laser design; based on measurement from testing of a first OPSSL fabricated according to the solid-state laser design to measure its instability and one or more of its heat flow and its temperature profile, adjusting the optically pumped solid-state laser design based on the measurements to compensate for thermal lensing in order to maintain lasing instability; and outputting the adjusted optically pumped solid-state laser design.

In some embodiments, the present invention provides a method that includes modeling, with a computer, operation of a semiconductor laser based on a design of the semiconductor laser; calculating a predicted beam quality from the modeled operation of the semiconductor laser based on at least one of thermal lensing, heat flow, and temperature profile; and changing the design of the semiconductor laser, and iterating the modeling of the operation of the semiconductor laser and the predicting of the beam quality to obtain an improved design of the semiconductor laser.

In some embodiments, the changing of the design of the semiconductor laser further comprises adjusting a feedback parameter.

In some embodiments, the changing of the design of the semiconductor laser further comprises adjusting a heat flow parameter.

In some embodiments, the changing of the design of the semiconductor laser further comprises adjusting an optical-pump-beam shape.

In some embodiments, the changing of the design of the semiconductor laser further comprises adjusting a heat-sink shape.

In some embodiments, the present invention provides a computer-readable medium having instructions stored thereon that, when run on a suitably programmed information processor performs a method that includes inputting an optically pumped solid-state-laser (OPSSL) design; modeling, on a computer, a heat flow and a temperature profile of the OPSSL design; adjusting the OPSSL design based on the modeling to compensate for thermal lensing in order to maintain lasing instability; and outputting the adjusted OPSSL design. In some such embodiments, the adjusting of the OPSSL design includes adjusting a feedback parameter, adjusting a heat flow parameter, adjusting an optical-pump-beam shape and/or adjusting a heat-sink shape. In some embodiments, the present invention provides a computer-readable medium having instructions stored thereon that, when run on a suitably programmed information processor performs a method that includes receiving pumping characteristics including stripe width and power level, and based upon these pumping characteristics, determining and outputting a design for an optically-pumped unstable-resonator semiconductor laser with a resonator negative radius of curvature R such that the inequality $$a^2 \geq \frac{4RP(1-\eta)}{\pi k} \cdot \frac{dn}{dT}$$

is satisfied by the laser, wherein a=stripe width (in units of length), R=convex mirror radius of curvature (in the units of length), P=incident pump power (in units of power), $\eta$=optical-to-optical efficiency, k=thermal conductivity (in units of power)/(units of length times·temperature), and n=index of refraction and dn/dT=temperature dependence of the index of refraction (in units of temperature$^{-1}$).

It is to be understood that the above description is intended to be illustrative, and not restrictive. Although numerous characteristics and advantages of various embodiments as described herein have been set forth in the foregoing description, together with details of the structure and function of various embodiments, many other embodiments and changes to details will be apparent to those of skill in the art upon reviewing the above description. The scope of the invention should be, therefore, determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

What is claimed is:

1. A method comprising:
providing an optically pumped solid-state-laser (OPSSL) design for a laser that includes a resonator having a negative radius of curvature on a face that intersects an optical axis of the laser in order to provide lasing instability, and that incurs thermal lensing during operation;
modeling a heat flow and a temperature profile of the OPSSL design;
adjusting the OPSSL design based on the modeling to compensate for the thermal lensing in order to maintain the lasing instability; and
fabricating a first optically pumped solid-state laser based on the adjusted OPSSL design, and operating the first optically pumped solid-state laser in a lasing-instability mode.

2. The method of claim 1, further comprising:
testing the first OPSSL to take measurements of its instability, its beam quality, and one or more of its heat flow and its temperature profile;
re-adjusting the OPSSL design based on the measurements to better compensate for thermal lensing in order to maintain lasing instability; and
fabricating a second optically pumped solid-state laser based on the re-adjusted OPSSL design.

3. The method of claim 1, wherein the optically pumped solid-state laser is an optically pumped semiconductor laser (OPSL).

4. The method of claim 1, wherein the fabricating of the laser includes providing a mirror external to the laser's gain medium, wherein a shape of the external mirror provides at least some compensation for thermal lensing to maintain laser beam quality.

5. The method of claim 1, the method further comprising:
assembling the first optically pumped solid-state laser as part of a device;
pumping the first optically pumped solid-state laser with more than three watts of pump power averaged over a thermal equilibration time of the device, wherein the pumping is intense enough to cause thermal lensing; and operating the first optically pumped solid-state laser while maintaining lasing instability even when the laser is being pumped with the more than three watts of pump power.

6. The method of claim 1, further comprising:

pumping the OPSSL through a major face of the OPSSL resonator; and lasing the OPSSL in a direction such that the emitted beam is essentially parallel to the major face of the resonator.

7. A laser made by a method comprising:

providing an optically pumped solid-state-laser (OPSSL) design for a laser that includes a resonator having a negative radius of curvature on a face that intersects an optical axis of the laser in order to provide lasing instability, and that incurs thermal lensing during operation;

modeling a heat flow and a temperature profile of the OPSSL design;

adjusting the OPSSL design based on the modeling to compensate for the thermal lensing in order to maintain the lasing instability; and fabricating a first optically pumped solid-state laser based on the adjusted OPSSL design, wherein the fabricating of the laser includes providing a mirror external to the laser's gain medium, wherein a shape of the external mirror provides at least some compensation for thermal lensing to maintain laser beam quality.

8. A method comprising:

providing an optically pumped solid-state laser design for a laser that includes a resonator having a negative radius of curvature on a face that intersects an optical axis of the laser in order to provide lasing instability, and that incurs thermal lensing during operation;

fabricating a first optically pumped solid-state laser (OPSSL) based on the optically pumped solid-state laser design;

testing the first OPSSL to measure its instability, and one or more of its heat flow and its temperature profile;

adjusting the optically pumped solid-state laser design based on the measurements to compensate for the thermal lensing in order to maintain the lasing instability; and fabricating a second optically pumped solid-state laser (OPSSL) based on the adjusted optically pumped solid-state laser design.

9. A method for producing an optically-pumped unstable-resonator semiconductor laser comprising:

choosing pumping characteristics including stripe width and power level of a pumped region of the optically-pumped unstable-resonator semiconductor laser, and based upon these pumping characteristics, building the optically-pumped unstable-resonator semiconductor laser with a resonator negative radius of curvature R such that the inequality $$a^2 \geq \frac{4RP(1-\eta)}{\pi k} \cdot \frac{dn}{dT}$$

is satisfied by the laser, wherein
a=stripe width (in units of length),
R=UR radius of curvature (in the units of length),
P=incident pump power (in units of power),
$\eta$=optical-to-optical efficiency,
k=thermal conductivity of material conducting heat away from the pumped region (in units of power)/(units of length*·temperature), and
n=index of refraction and dn/dT=temperature dependence of the index of refraction (in units of temperature$^{-1}$).

10. The method of claim 9, further comprising:

after the building of the laser, operating the laser under optical pumping conditions wherein the inequality $$a^2 \geq \frac{4RP(1-\eta)}{\pi k} \cdot \frac{dn}{dT}$$

is satisfied by the laser.

11. A method comprising:

modeling, with a computer, operation of a semiconductor laser based on a design of the semiconductor laser that includes a resonator having a negative radius of curvature on a face that intersects an optical axis of the laser in order to provide lasing instability, and that incurs thermal lensing during operation;

calculating a predicted beam quality from the modeled operation of the semiconductor laser based on at least one of thermal lensing, heat flow, and temperature profile;

changing the design of the semiconductor laser, and iterating the modeling of the operation of the semiconductor laser and the predicting of the beam quality to obtain an improved design of the semiconductor laser; and fabricating a first optically pumped semiconductor laser based on the improved semiconductor laser design, and operating the first optically pumped solid-state laser in a lasing-instability mode.

12. The method of claim 11, wherein the changing of the design of the semiconductor laser further comprises adjusting a feedback parameter.

13. The method of claim 11, wherein the changing of the design of the semiconductor laser further comprises adjusting a heat flow parameter.

14. The method of claim 11, wherein the changing of the design of the semiconductor laser further comprises adjusting an optical-pump-beam shape.

15. The method of claim 11, wherein the changing of the design of the semiconductor laser further comprises adjusting a heat-sink shape.

16. A non-transitory computer-readable medium having instructions stored thereon that, when run on a suitably programmed information processor performs a method comprising:

inputting an optically pumped solid-state-laser (OPSSL) design for a laser that includes a resonator having a negative radius of curvature on a face that intersects an optical axis of the laser in order to provide lasing instability, and that incurs thermal lensing during operation;

modeling, on a computer, a heat flow and a temperature profile of the OPSSL design;

adjusting the OPSSL design based on the modeling to compensate for the thermal lensing in order to maintain the lasing instability; and outputting the adjusted OPSSL design.

17. The computer-readable medium of claim 16, wherein the adjusting of the OPSSL design includes adjusting a feedback parameter.

18. The computer-readable medium of claim 16, wherein the adjusting of the OPSSL design includes adjusting a heat flow parameter.

19. The computer-readable medium of claim 16, wherein the adjusting of the OPSSL design includes adjusting an optical-pump-beam shape.

20. The computer-readable medium of claim 16, wherein the adjusting of the OPSSL design includes adjusting a heat-sink shape.

21. A method comprising:
providing an optically pumped solid-state-laser (OPSSL) design;
modeling a heat flow and a temperature profile of the OPSSL design;
adjusting the OPSSL design based on the modeling to compensate for thermal lensing in order to maintain lasing instability; and
fabricating a first optically pumped solid-state laser based on the adjusted OPSSL design, wherein the first optically pumped solid-state laser is a semiconductor laser, the method further comprising:
operating the first optically pumped solid-state laser as an unstable-resonator under pumping conditions wherein the inequality $$a^2 \geq \frac{4RP(1-\eta)}{\pi k} \cdot \frac{dn}{dT}$$

is satisfied by the laser, wherein
a=stripe width (in units of length),
R=UR radius of curvature (in the units of length),
P=incident pump power (in units of power),
η=optical-to-optical efficiency,
k=thermal conductivity of material conducting heat away from the pumped region (in units of power)/(units of length*·temperature), and
n=index of refraction and dn/dT=temperature dependence of the index of refraction (in units of temperature$^{-1}$).

22. A non-transitory computer-readable medium having instructions stored thereon that, when run on a suitably programmed information processor performs a method comprising:
modeling, with the information processor, operation of a semiconductor laser based on a design of the semiconductor laser that includes a resonator having a negative radius of curvature on a face that intersects an optical axis of the laser in order to provide lasing instability, and that incurs thermal lensing during operation;
calculating, with the information processor, a predicted beam quality from the modeled operation of the semiconductor laser based on at least one of thermal lensing, heat flow, and temperature profile; and
receiving into the information processor changes of the design of the semiconductor laser, and iterating the modeling of the operation of the semiconductor laser and the predicting of the beam quality to obtain an improved design of the semiconductor laser.

23. A non-transitory computer-readable medium having software that, when run on a suitably programmed information processor performs a method comprising:
receiving pumping characteristics including stripe width and power level of a pumped region, and based upon these pumping characteristics, determining and outputting a design for an optically-pumped unstable-resonator solid-state laser with a resonator negative radius of curvature R such that the inequality $$a^2 \geq \frac{4RP(1-\eta)}{\pi k} \cdot \frac{dn}{dT}$$

is satisfied by the laser, wherein
a=stripe width (in units of length),
R=UR radius of curvature (in the units of length),
P=incident pump power (in units of power),
η=optical-to-optical efficiency,
k=thermal conductivity of material conducting heat away from the pumped region (in units of power)/(units of length*·temperature), and
n=index of refraction and dn/dT=temperature dependence of the index of refraction (in units of temperature$^{-1}$).

24. The method of claim 23, wherein the optically pumped solid-state laser is an optically pumped semiconductor laser (OPSL).

25. A method for producing an optically-pumped unstable-resonator solid-state laser comprising:
choosing pumping characteristics including stripe width and power level of a pumped region of the optically-pumped unstable-resonator solid-state laser, and based upon these pumping characteristics, building the optically-pumped unstable-resonator solid-state laser with a resonator negative radius of curvature R such that the inequality $$a^2 \geq \frac{4RP(1-\eta)}{\pi k} \cdot \frac{dn}{dT}$$

is satisfied by the laser, wherein
a=stripe width (in units of length),
R=UR radius of curvature (in the units of length),
P=incident pump power (in units of power),
η=optical-to-optical efficiency,
k=thermal conductivity of material conducting heat away from the pumped region (in units of power)/(units of length*·temperature), and
n=index of refraction and dn/dT=temperature dependence of the index of refraction (in units of temperature$^{-1}$).

26. An optically-pumped unstable-resonator solid-state laser apparatus, wherein the optically-pumped unstable-resonator solid-state laser apparatus is made according to a method comprising:
providing a first optically pumped solid-state-laser (OPSSL) design for a laser that includes a resonator having a first negative radius of curvature on a face that intersects an optical axis of the laser in order to provide lasing instability, and that incurs thermal lensing during operation;
modeling a heat flow and a temperature profile of the first OPSSL design;
adjusting the OPSSL design based on the modeling to compensate for the thermal lensing in order to maintain the lasing instability; and
fabricating the optically-pumped unstable-resonator solid-state laser apparatus according to the adjusted OPSSL design, and operating the first optically pumped solid-state laser apparatus in a lasing-instability mode.

* * * * *